United States Patent
Kim et al.

(10) Patent No.: US 7,486,577 B2
(45) Date of Patent: Feb. 3, 2009

(54) REPAIR CIRCUIT AND METHOD OF REPAIRING DEFECTS IN A SEMICONDUCTOR MEMORY DEVICE

(75) Inventors: Hyung-Jik Kim, Seongnam-si (KR); Byung-Hoon Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 11/604,700

(22) Filed: Nov. 28, 2006

(65) Prior Publication Data

US 2007/0133323 A1    Jun. 14, 2007

(30) Foreign Application Priority Data

Dec. 3, 2005    (KR) .................. 10-2005-0117258

(51) Int. Cl.
*G11C 7/00*    (2006.01)
(52) U.S. Cl. .............. 365/200; 365/225.7; 365/230.08; 365/189.05
(58) Field of Classification Search .................. 365/200, 365/225.7, 230.08, 189.05, 189.07
See application file for complete search history.

(56) References Cited

U.S. PATENT DOCUMENTS 6,809,972 B2 * 10/2004 Lehmann et al. ............ 365/200
7,286,419 B2 * 10/2007 Doi ............................. 365/200

FOREIGN PATENT DOCUMENTS

KR    1999-006005    1/1999
KR    1020030057299 A    7/2003

* cited by examiner

*Primary Examiner*—David Lam
(74) *Attorney, Agent, or Firm*—Volentine & Whitt, PLLC (57) ABSTRACT

A repair circuit and related method of repair are disclosed. In the repair circuit, row repair or column repair control units are selectively actuated to perform respective repair functions within a semiconductor memory device in relation to a commonly provided defective address. Both post-package defects and/or before package defects may be repaired in response to the defective address.

17 Claims, 8 Drawing Sheets

REPAIR CIRCUIT AND METHOD OF REPAIRING DEFECTS IN A SEMICONDUCTOR MEMORY DEVICE

BACKGROUND OF THE INVENTION

1. Field of the Invention

The present invention relates to semiconductor memory devices. More particularly, the present invention relates to a repair circuit and a method of repairing defects in a semiconductor memory device.

This application claims priority under 35 USC § 119 to Korean Patent Application No. 2005-117258, filed on Dec. 3, 2005, the subject matter of which is incorporated herein in its entirety by reference.

2. Description of the Related Art

A semiconductor memory device generally includes a main memory array having a plurality of memory cells, and a redundant memory array having redundant memory cells adapted for use in the repair of defective memory cells in the main array. It is preferable that all memory cells of the main memory array operate normally. However, defective memory cells are often formed within the main memory array due to variations in the manufacturing processes used to fabricate the memory cells as well as variations in electrical performance characteristics across a large number of memory cells. When a defective memory cell is identified in the main memory array, it may be replaced (or substituted) with one of the redundant memory cells. This capability ensures uniformly acceptable memory cell performance across the entire main memory array.

In general, at various stages during the lengthy sequence of fabrication processes used to manufacture a semiconductor memory device, tests are performed to determine whether or not the memory cells are operating normally. After each test, a memory cell identified as defective may be replaced with a redundant memory cell. This test, identification, and replacement procedure is typically performed while the semiconductor memory device is still in its "wafer state", i.e., before individual dies are cut from the fabrication wafer and packaged into individual device form.

There are many different types of memory cell defects, including row related defects and/or column related defects. That is, while some memory cell defects are identified in relation to a particular memory cell, memory cell defects are more commonly identified as a defective row or column. As a result, semiconductor memory devices require both a row repair circuit and a column repair circuit in order to remedy row defects and column defects, respectively.

Conventional repair techniques may be divided into before-package repair (BPR) techniques—adapted to repair identified defects in wafer state devices, and post-package repair (PPR) techniques—adapted to repair defects in a packaged devices. PPR techniques are commonly used to repair defective memory cells which remained unidentified in the wafer state, but which were subsequently identified during package level testing. Both PPR and BPR techniques require row repair and column repair circuits.

Some PPR techniques use electrical fuse circuits (e-fuses) instead of laser fuse circuits to repair defective memory cells and improve package yield for the semiconductor memory devices. E-fuse circuits offer several performance advantages, but tend to be more complicated in their layout relative to laser fuse circuits. Thus, conventional PPR techniques incorporating both the row and column repair circuits using e-fuse circuits occupy an unacceptably large layout area within the overall semiconductor memory device. This quality is at odds with continuing pressure to increase the fabrication density of memory devices.

SUMMARY OF THE INVENTION

In contrast, a repair circuit and method of repairing defects in a semiconductor memory device according to embodiments of the present invention significantly reduce the negative layout impact typically associated with conventional PPR techniques.

In one embodiment, the invention provides a repair circuit for a semiconductor memory device, comprising; an address generating unit configured to generate a row address or a column address in response to a control signal, an address electrical fuse (e-fuse) box unit configured to store a defective address after packaging, a row/column selecting e-fuse unit configured to generate a select signal for determining whether the defective address corresponds to a row defect or a column defect, a row repair control unit configured to compare the defective address after packaging with the row address in response to a first state of the select signal, and a column repair control unit configured to compare the defective address after packaging with the column address in response to a second state of the select signal.

In another embodiment, the invention provides a method of repairing defects in a semiconductor memory device, comprising; identifying a defective address in the semiconductor memory device after packaging, generating a post-package repair (PPR) master signal, programming a row/column selecting e-fuse unit based on whether the defective address corresponds to a row defect or a column defect, storing the defective address in an address e-fuse box unit, comparing the defective address stored in the address e-fuse box unit with a row address when the defective address corresponds to the row defect, and comparing the defective address stored in the address e-fuse box unit with a column address when the defective address corresponds to the column defect.

In another embodiment, the invention provides a repair circuit for a semiconductor memory device, comprising; an address fuse unit configured to perform electrical programming of a fuse in accordance with a defective address identified in the semiconductor memory device after packaging, a row/column selecting fuse unit configured to perform electrical programming of a fuse in accordance with an indication of whether the defective address corresponds to a row defect or a column defect, a row repair control unit configured to drive a row repair circuit when a row address identical to the defective address programmed in the address fuse unit is input in response to a programming state of the row/column selecting fuse unit, and a column repair control unit configured to drive a column repair circuit when a column address identical to the defective address programmed in the address fuse unit is input in response to a programming state of the row/column selecting fuse unit.

In another embodiment, the invention provides a method of repairing defects in a semiconductor memory device, comprising; performing electrical programming of a fuse in accordance with a defective address in the semiconductor memory device identified after packaging, performing electrical programming of a fuse in accordance with an indication of whether the defective address corresponds to a row defect or a column defect, and driving a row repair circuit or a column repair circuit when a row address or a column address identical to the defective address is input in response to a defined programming state.

In another embodiment, the invention provides a repair circuit for a semiconductor memory device, comprising; an address fuse unit configured to electrically program a defective address ascertained after packaging into one address fuse box, and a row/column selecting fuse unit configured to electrically program the one fuse box in accordance with a determination of whether the programmed defective address corresponds to a row defect or a column defect.

In another embodiment, the invention provides a method of repairing defects in a semiconductor memory device, comprising; electrically programming a defective address identified after packaging into one address fuse box, and performing electrical programming of a fuse in accordance with an indication of whether the defective address corresponds to a row defect or a column defect.

DESCRIPTION OF EMBODIMENTS

Embodiments of the present invention will now be described with reference to the accompanying drawings. The present invention may, however, be embodied in many different forms and should not be construed as being limited to only the illustrated embodiments. Rather, these embodiments are presented as teaching examples. Throughout the drawings and written description, like reference numerals refer to like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
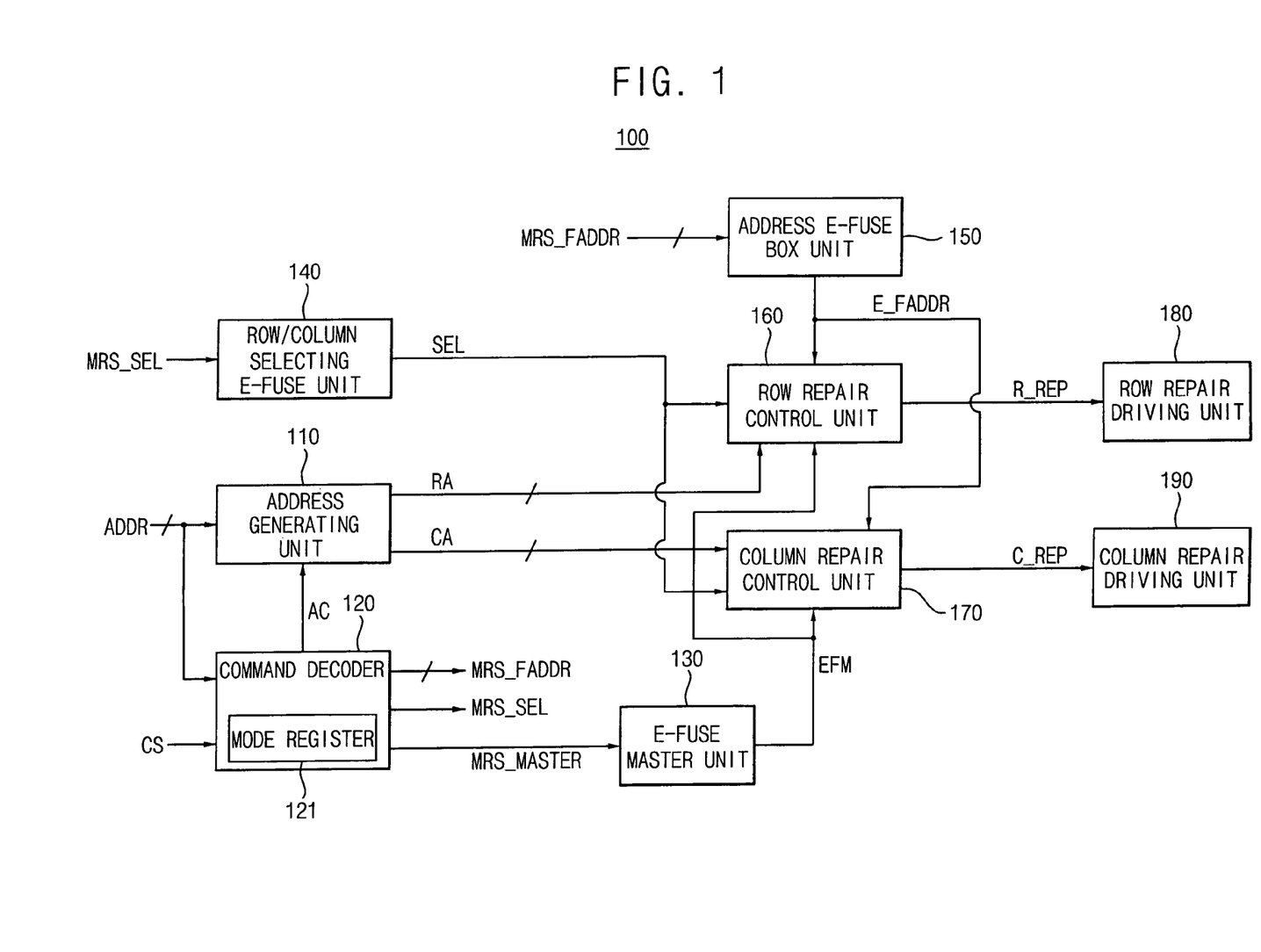
FIG. 1 is a block diagram illustrating a semiconductor memory device according to an example embodiment of the present invention.

FIG. 1 is a block diagram illustrating a semiconductor memory device according to an embodiment of the invention.

Referring to FIG. 1, a memory device 100 includes an address generating unit 110, a command decoder 120 including a mode register 121, an electrical fuse (e-fuse) master unit 130, a row/column selecting e-fuse unit 140, an address e-fuse box unit 150, a row repair control unit 160, a column repair control unit 170, a row repair driving unit 180, and a column repair driving unit 190.

The address generating unit 110 receives address signals ADDR from the exterior to generate row addresses RA or column addresses CA in response to a control signal AC outputted from the command decoder 120.

The command decoder 120 outputs the control signal AC to control the address generating unit 110 in response to a command signal CS from the exterior. The mode register 121 in the command decoder 120 provides a master signal MRS_MASTER for a post-package repair (PPR) to the e-fuse master unit 130. Further, upon initiation of a PPR operation, the command decoder 120 receives defective address signals ADDR to generate fuse address control signals MRS_FADDR for cutting a fuse of the address e-fuse box unit 150 and a row/column selecting e-fuse control signal MRS_SEL for determining whether to perform a row PPR operation or a column PPR operation during the PPR, wherein the PPR indicates a PPR for repairing a defective cell after packaging.

The e-fuse master unit 130 provides an e-fuse master signal EFM to the row repair control unit 160 and the column repair control unit 170 in response to the PPR master signal MRS_MASTER. The e-fuse master signal EFM indicates the performance of a row PPR operation or a column PPR operation.

The row/column selecting e-fuse unit 140 receives the row/column selecting e-fuse control signal MRS_SEL to generate a select signal SEL. In the illustrated example, the select signal SEL corresponds to a first state indicating a row PPR or a second state indicating a column PPR according to an electrical programming.

The address e-fuse box unit 150 includes a plurality of e-fuse units capable of storing defective address information obtained during post-packaging testing. The plurality of e-fuse units are adapted to store the defective addresses E_FADDR based on whether or not an e-fuse unit corresponding to the fuse address control signals MRS_FADDR is cut.

The row repair control unit 160 compares the defective address E_FADDR with the row addresses RA output from the address generating unit 110 in response to the first state of the select signal SEL. According to this comparison result, the row repair control unit 160 outputs a row repair enable signal R_REP for enabling the row repair driving unit 180.

The column repair control unit 170 compares the defective address E_FADDR with the column addresses CA output from the address generating unit 110 in response to the second state of the select signal SEL. According to this comparison result, the column repair control unit 170 outputs a row repair enable signal C_REP for enabling the column repair driving unit 190.

The row repair driving unit 180 drives a corresponding word line in response to the row repair enable signal R_REP, and column repair driving unit 190 drives a corresponding bit line in response to the column repair enable signal C_REP.

The row/column selecting e-fuse unit 140 may be programmed according to type. That is, the row/column selecting e-fuse unit 140 may be programmed in accordance with an identified row defect or column defect related to the defective address obtained after packaging. Then, the e-fuse units of the address e-fuse box unit 150 may be programmed to store the defective address. In accordance with the programming of the row/column selecting e-fuse unit 140, the row defect and/or column defect may be selectively repaired using the address e-fuse box unit 150.

Figure 2:
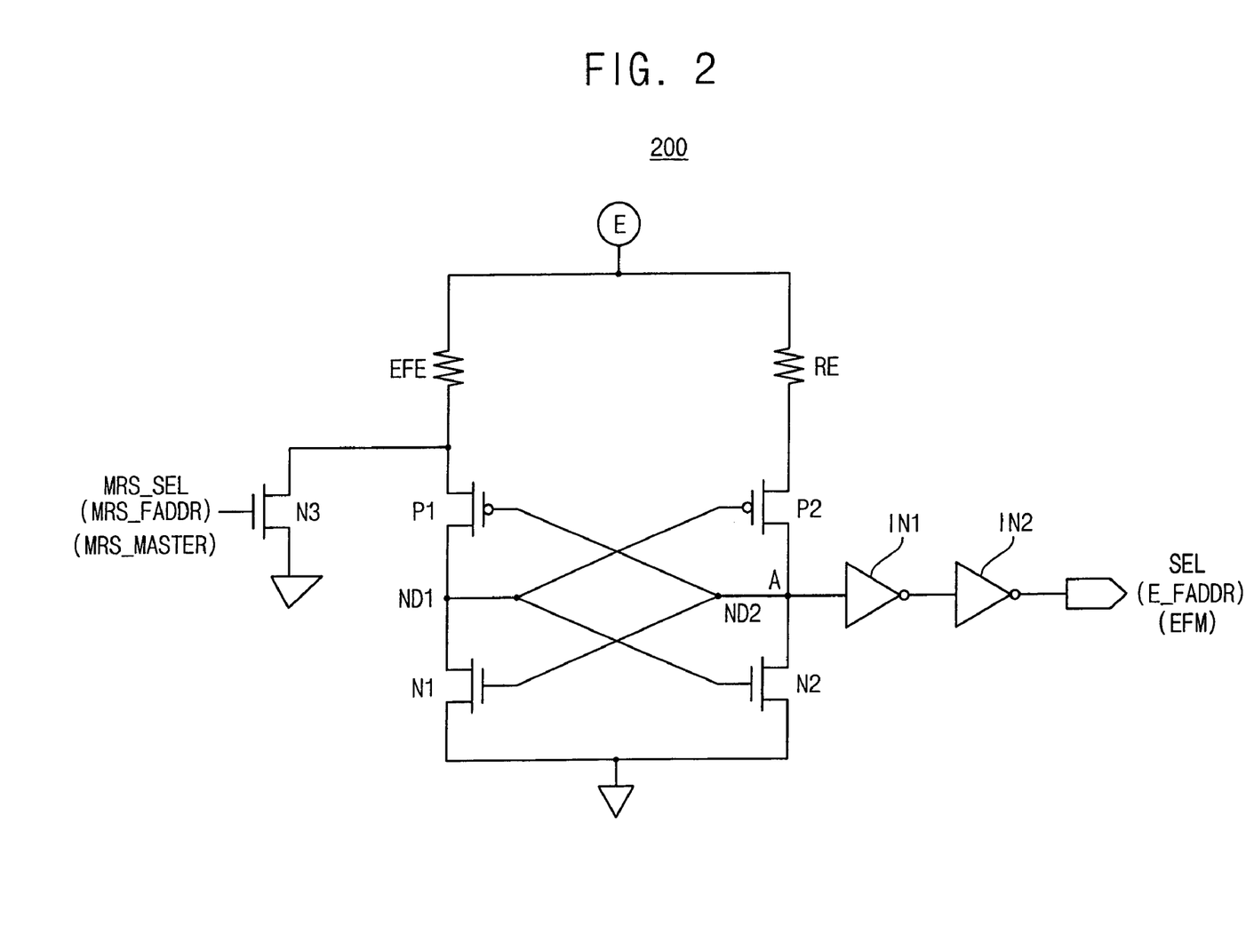
FIG. 2 is a circuit diagram illustrating an electrical fuse (e-fuse) unit according to an example embodiment of the present invention.

FIG. 2 is a circuit diagram illustrating an e-fuse unit according to an embodiment of the invention.

An e-fuse unit 200 shown in FIG. 2 may be applied to each of the row/column selecting e-fuse unit 140, the address e-fuse box unit 150 and the e-fuse master unit 130 shown in FIG. 1. FIG. 2 shows a particular case in which the e-fuse unit 200 is applied to the row/column selecting e-fuse unit 140. In the illustrated example, the parenthesized reference signals indicate input/output signals corresponding to other cases in which the e-fuse unit 200 is analogously applied to the address e-fuse box unit 150 and the e-fuse master unit 130.

Referring to FIG. 2, the e-fuse unit 200 includes a fuse element EFE, a resistor element RE, first, second and third N-type metal-oxide semiconductor (NMOS) transistors N1, N2 and N3, first and second P-type metal-oxide semiconductor (PMOS) transistors P1 and P2, and first and second inverters IN1 and IN2.

In the illustrated example, the resistor element RE is implemented to have a resistance approximately ten times larger than the resistance of the fuse element EFE. The drain of the first NMOS transistor N1 and gates of the second PMOS transistor P2 and the second NMOS transistor N2 are commonly coupled to a first node ND1. The drain of the second NMOS transistor N2 and gates of the first PMOS transistor P1 and the first NMOS transistor N1 are commonly coupled to a second node ND2. The sources of the first, second and third NMOS transistors N1, N2 and N3 are commonly coupled to ground, and the sources of the PMOS transistors P1 and P2 are coupled to a supply voltage through the fuse element EFE and the resistor element RE, respectively. The drain of the third NMOS transistor N3 is coupled to the source of the first PMOS transistor P1. A signal apparent at the second node ND2 is provided to the first inverter IN1 and an output signal of the first inverter IN1 is provided to the second inverter IN2.

When the e-fuse unit 200 corresponds to the row/column selecting e-fuse unit 140, the gate of the third NMOS transistor N3 receives the row/column selecting e-fuse control signal MRS_SEL and the second inverter IN2 outputs the select signal SEL. However, when the e-fuse unit 200 corresponds to the address e-fuse box unit 150, the gate of the third NMOS transistor N3 receives the fuse address control signals MRS_FADDR and the second inverter IN2 outputs the defective address E_FADDR. Analogously, when the e-fuse unit 200 corresponds to the e-fuse master unit 130, the gate of the third NMOS transistor N3 receives the PPR master signal MRS_MASTER and the second inverter IN2 outputs the e-fuse master signal EFM.

When the e-fuse unit 200 is in initial state, the first node ND1 is set (i.e., a corresponding voltage level is established) to a logic level "HIGH" and the second node ND2 is set to a logic level "LOW" according to a difference between the respective resistances of the e-fuse element EFE and the resistor element RE. Under these exemplary conditions, the output of the e-fuse unit 200 is set to a logic level "LOW."

For example, in the case where the e-fuse unit 200 corresponds to the row/column selecting e-fuse unit 140, when the row/column selecting e-fuse control signal MRS_SEL is at a logic level "HIGH," the third NMOS transistor N3 is turned ON so that the e-fuse unit 200 is programmed. Then, an over-current flows to and blows (i.e., electrically opens) the fuse element EFE. As a result, the node ND1 transitions to a logic level "LOW," the node ND2 transitions to a logic level "HIGH," and the output of the e-fuse unit 200 (e.g., the select signal SEL) becomes a logic level "HIGH."

Hereinafter, an exemplary post-packaging programming method for the e-fuse unit 200 will be described with reference to FIGS. 1 and 2.

A defective cell (e.g., its address) is ascertained through a serially applied sequence of tests after packaging of a semiconductor memory device. A further determination is made as to whether the identified defective cell is the row defect or the column defect. When the defective address is the row defect, the row/column selecting e-fuse control signal MRS_SEL is set at a logic level "HIGH" from the mode register 121 to the row/column selecting e-fuse unit 140, and the select signal SEL is set to a logic level "HIGH." When the defective address is the column defect, the row/column selecting e-fuse control signal MRS_SEL is set at a logic level "LOW" from the mode register 121 to the row/column selecting e-fuse unit 140, and the select signal SEL is set to a logic level "LOW."

Subsequently, an address corresponding to the defective address is applied to the mode register 121 of the command decoder 120 so that the mode register 121 may generate the fuse address control signal MRS_FADDR. The mode register 121 provides the fuse address control signal MRS_FADDR to the address e-fuse box unit 150 so that the fuse address control signal MRS_FADDR is applied to corresponding e-fuse units of the address e-fuse box unit 150 to program the e-fuse unit. Also, the defective address is stored in the address e-fuse box unit 150. Simultaneously, the PPR master signal MRS_MASTER is set to a logic level "HIGH" from the mode register 121 to the e-fuse master unit 130 so that the e-fuse master signal EFM is set at a logic level "HIGH."

Figure 3A:
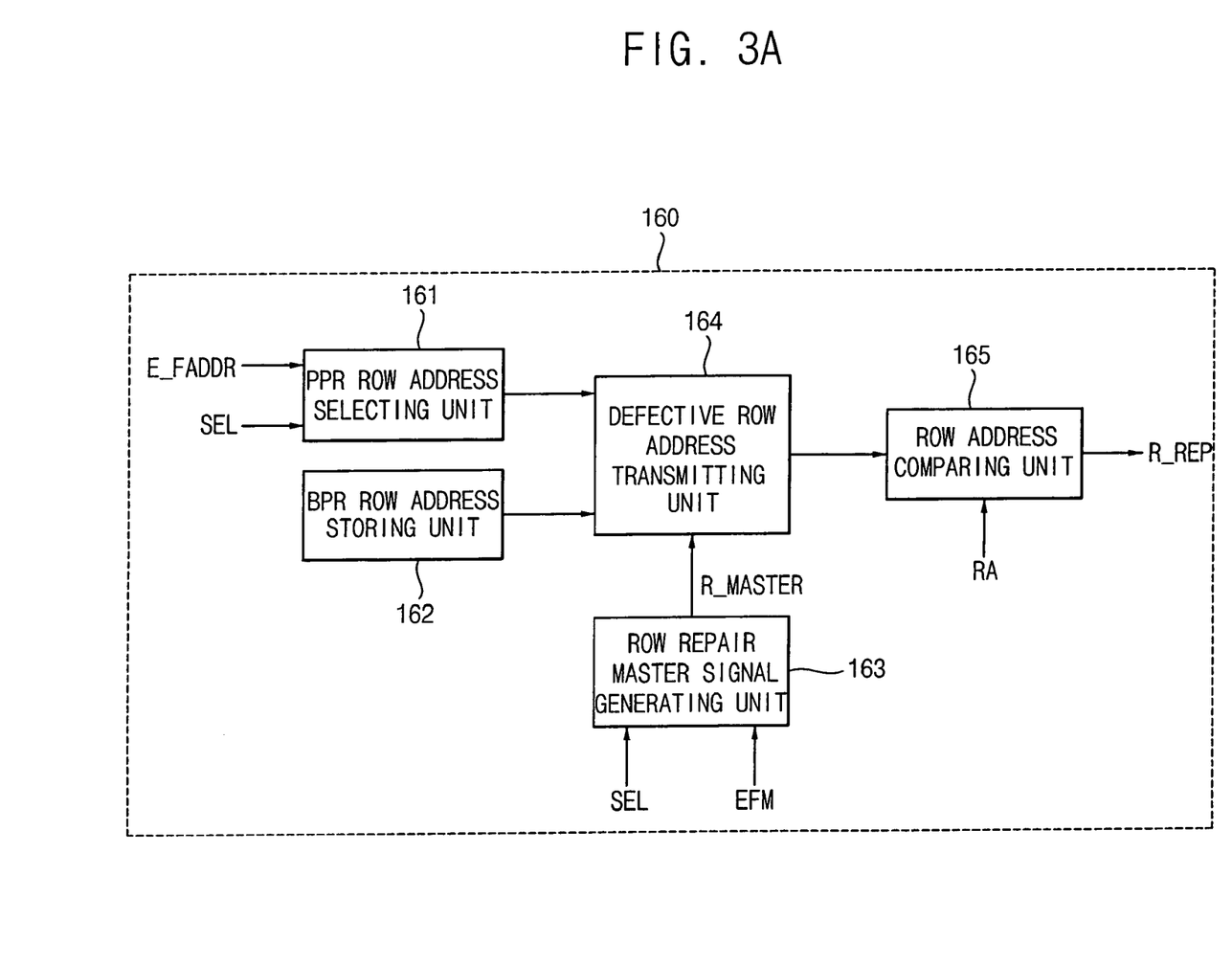
FIGS. 3A and 3B are block diagrams illustrating a row repair control unit and a column repair control unit in FIG. 1, respectively.
Figure 3B:
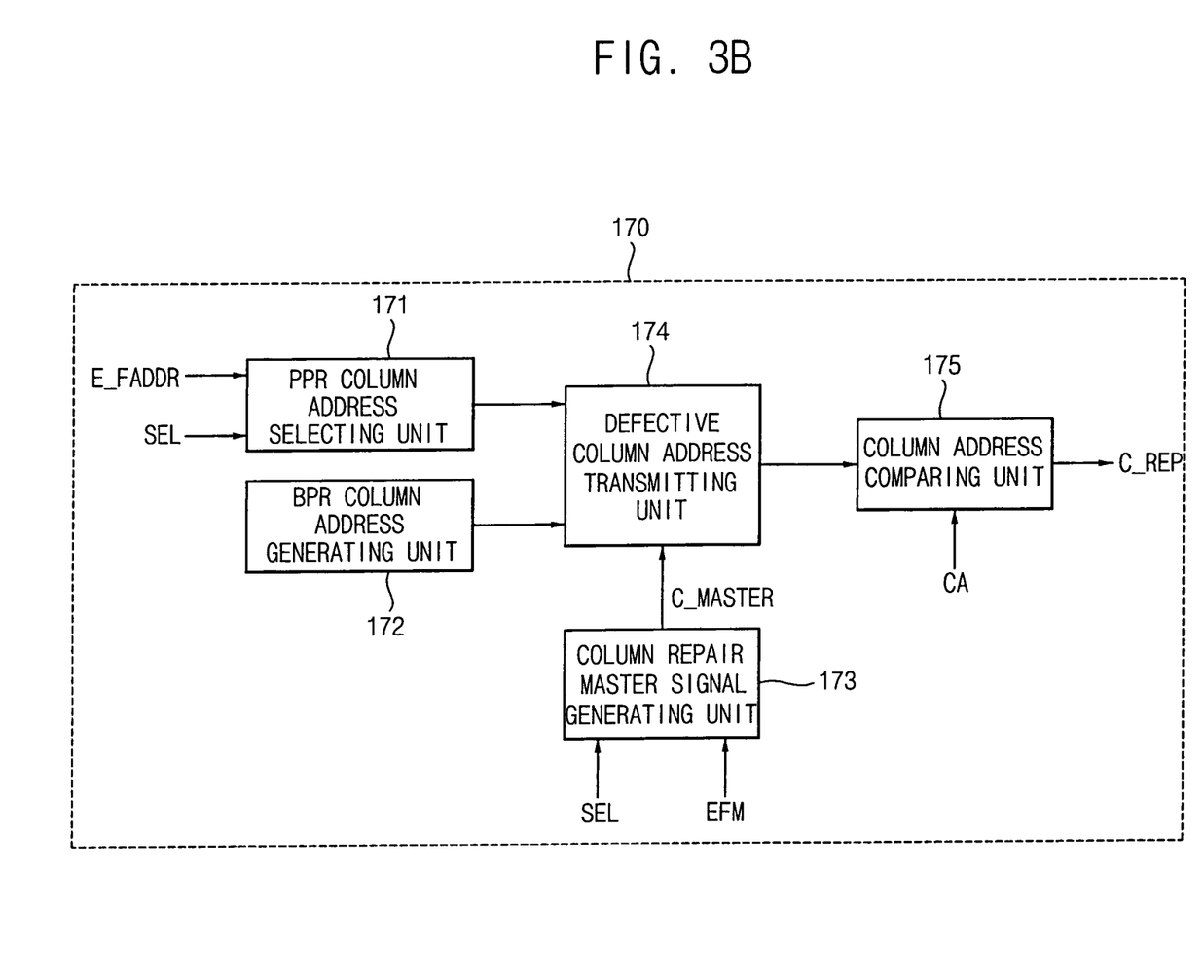

FIGS. 3A and 3B are block diagrams further illustrating the row repair control 160 unit and a column repair control unit 170 of FIG. 1, respectively.

The row repair control unit 160 includes a PPR row address selecting unit 161, a before-package repair (BPR) row address storing unit 162, a row repair master signal generating unit 163, a defective row address transmitting unit 164 and a row address comparing unit 165, wherein the BPR indicates a BPR adapted to repair a defective cell in a wafer state. A detailed description of the column repair control unit 170 may be omitted at this stage because the column repair control unit 170 may have a configuration similar to the row repair control unit 160.

Figure 4A:
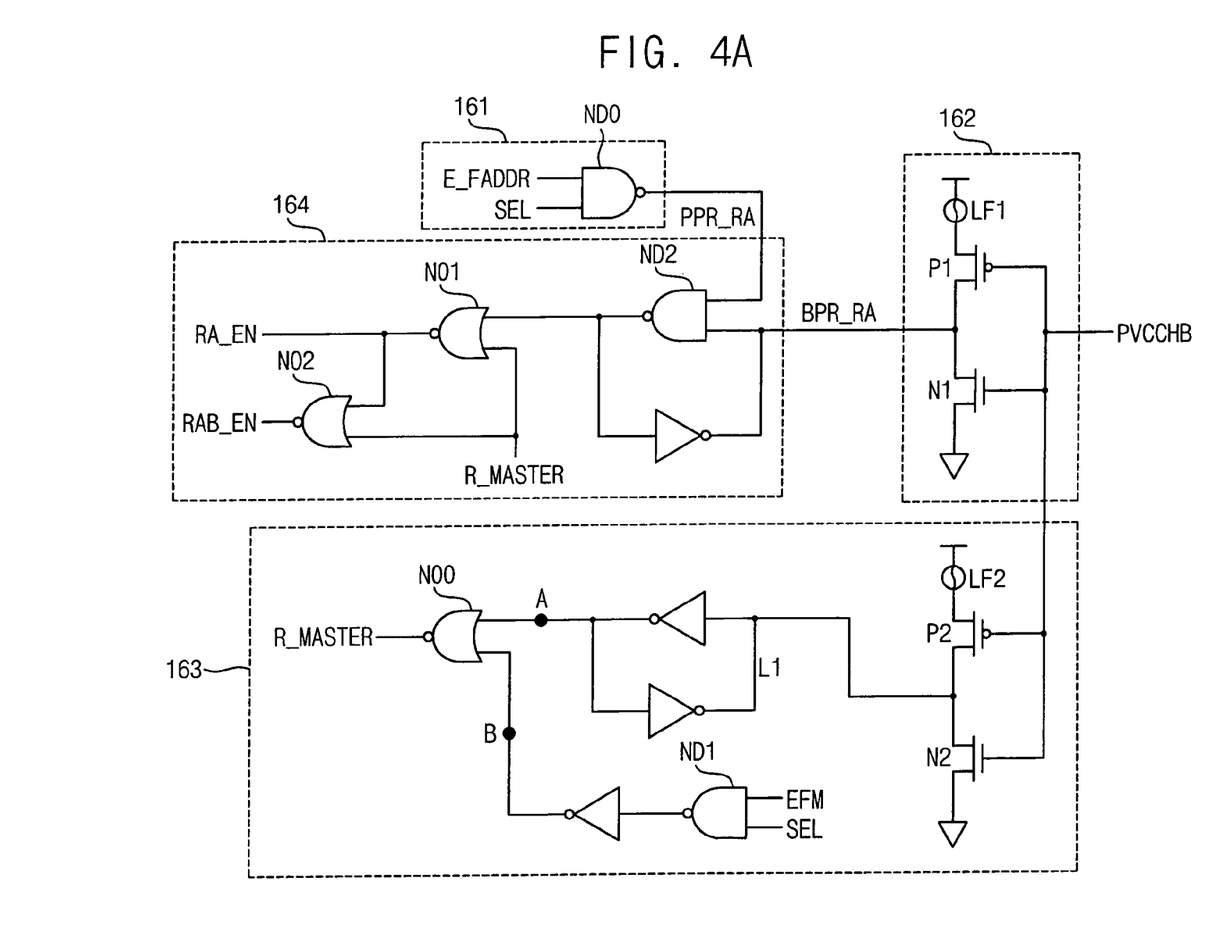
FIGS. 4A and 4B are circuit diagrams illustrating the row repair control unit excluding a row address comparing unit in FIG. 3A, and the column repair control unit excluding a column address comparing unit in FIG. 3B, respectively.
Figure 4B:
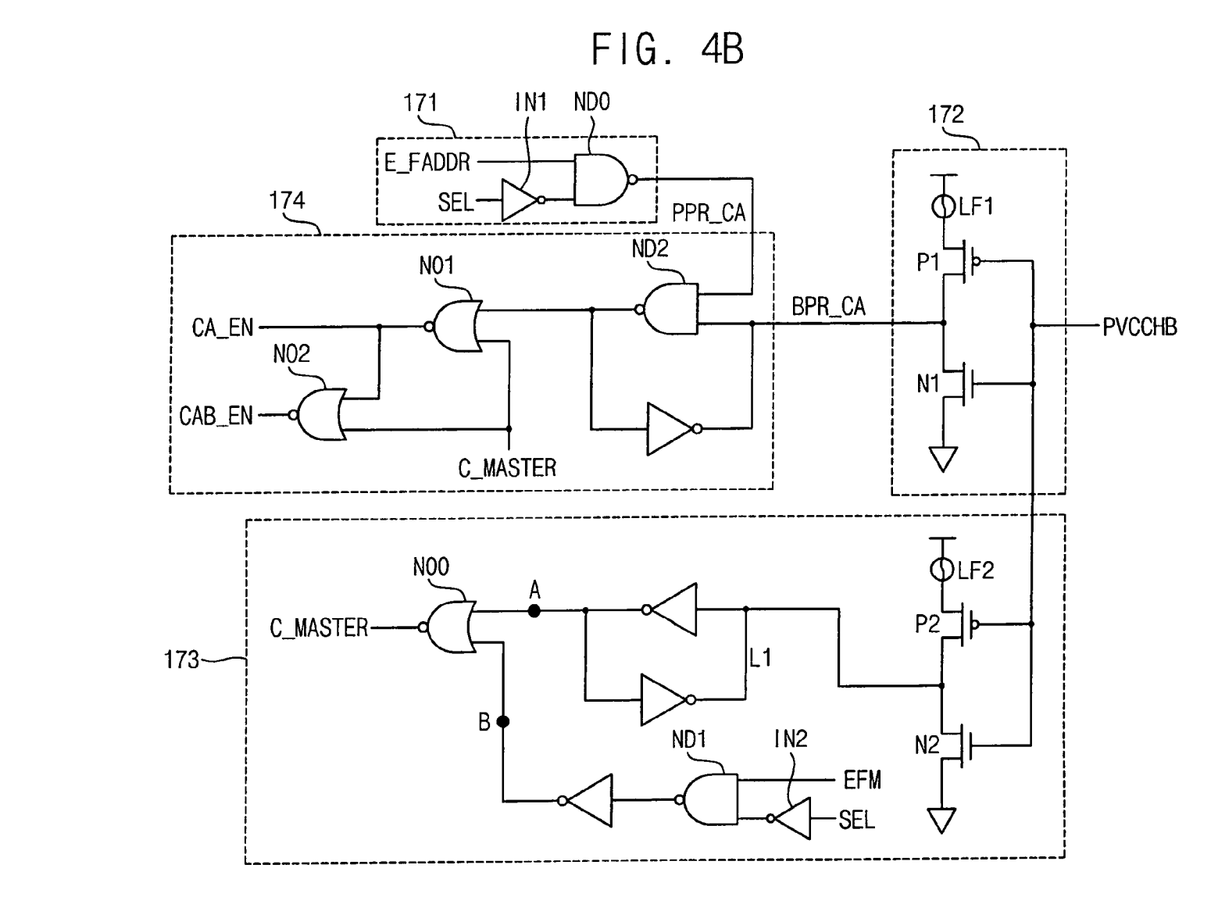
Figure 5A:
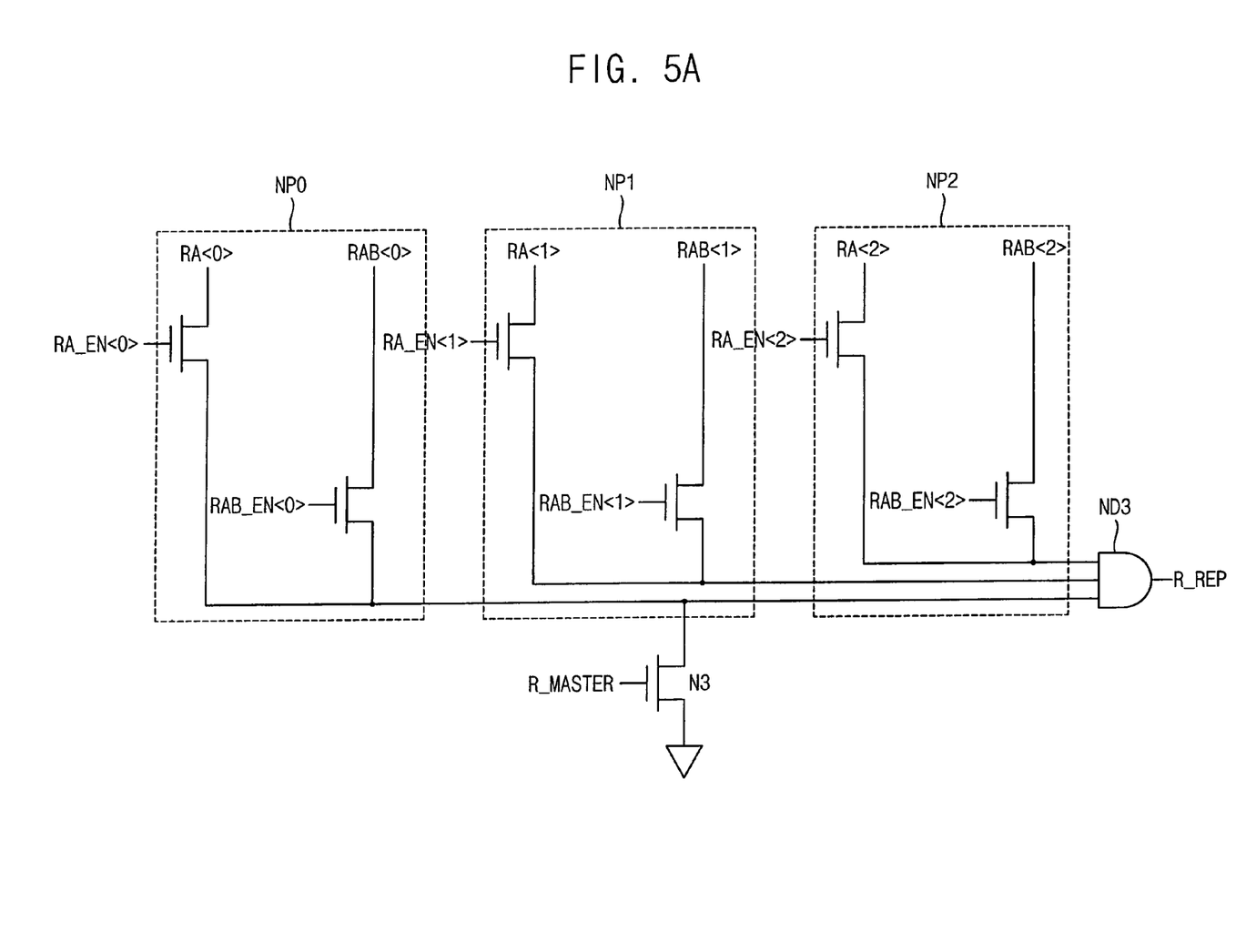
FIGS. 5A and 5B are circuit diagrams illustrating the row address comparing unit of the row repair control unit in FIG. 3A, and the column address comparing unit of the column repair control unit in FIG. 3B, respectively.
Figure 5B:
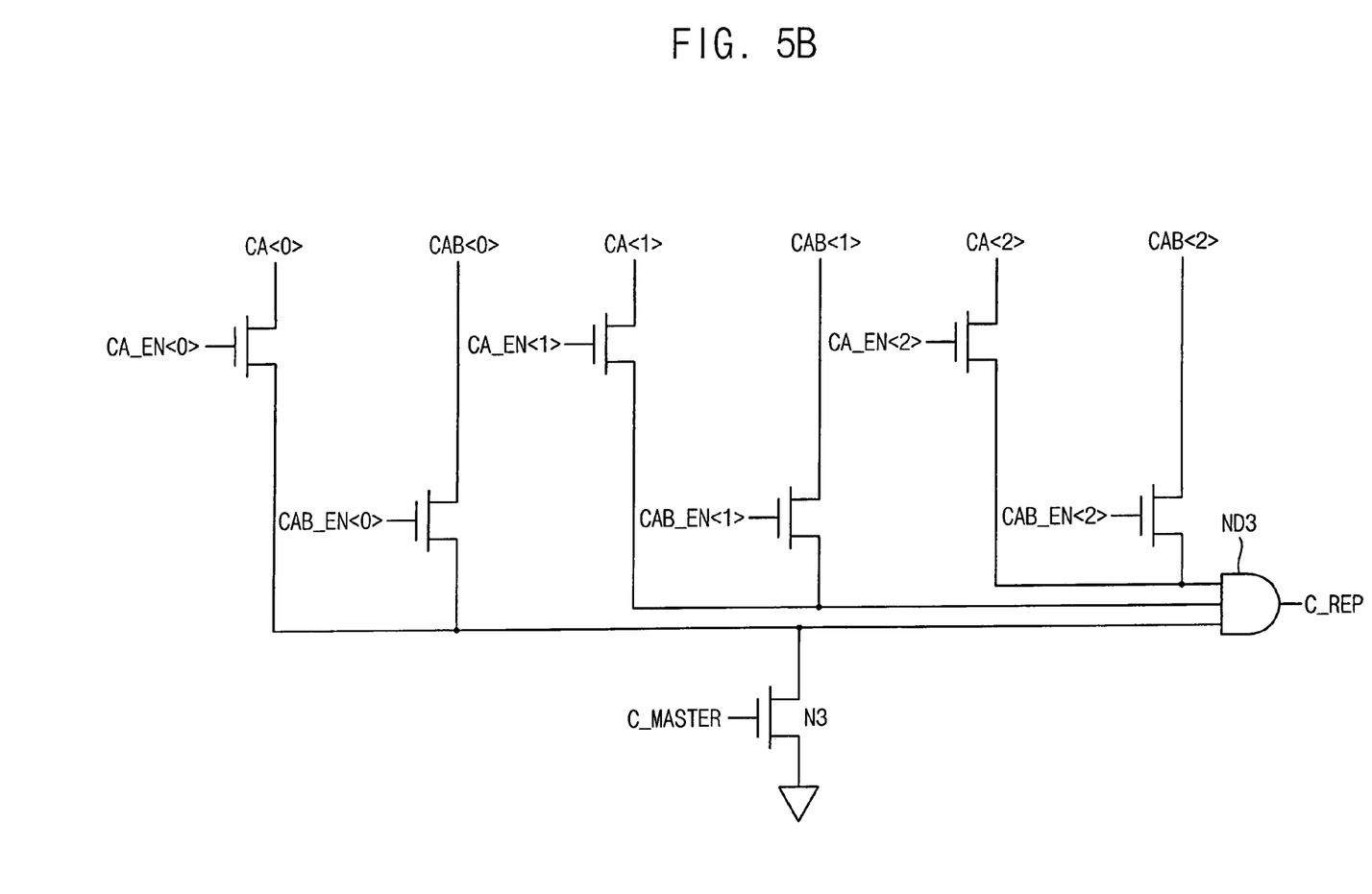

FIGS. 4A and 4B are circuit diagrams further illustrating the row repair control unit 160, excluding a row address comparing unit of FIG. 3A, and the column repair control unit 170, excluding a column address comparing unit of FIG. 3B, respectively. Also, FIGS. 5A and 5B are circuit diagrams further illustrating the row address comparing unit 165 of the row repair control unit 160 of FIG. 3A, and the column address comparing unit 175 of the column repair control unit 170 of FIG. 3B, respectively.

Hereinafter, an exemplary implementation and operation of the row repair control unit 160 will be described with reference to FIGS. 3A through 5B. An exemplary operation of the column repair control unit 170 may be easily understood by those of ordinary skill in the art following consideration of the exemplary implementation and operation of the row repair control unit 160 described hereinafter. Therefore, a detailed explanation of the exemplary implementation and operation of the column repair control unit 170 will be omitted for the sake of brevity.

As shown in FIGS. 3A and 4A, the PPR row address selecting unit 161 includes a NAND gate ND0 receiving the defective address E_FADDR and providing a PPR defective row address PPR_RA to the defective row address transmitting unit 164 in response to the select signal SEL having a first state (e.g., a logic level of "HIGH") in order to indicate a row PPR.

The BPR row address storing unit 162 includes a laser fuse LF1, a PMOS transistor P1 and an NMOS transistor N1. The BPR row address storing unit 162 programs the laser fuse LF1 to store a BPR defective row address BPR_RA in a wafer state. A power-up bar signal PVCCHB may be an inverted version of a power-up signal PVCCH. In the illustrated examples, the power-up bar signal PVCCHB is maintained at a logic level "HIGH" during a power-up operation. Then, the power-up bar signal PVCCHB transitions to a logic level "LOW" after the power-up operation and is maintained at this level. When the defective row address BPR_RA of the wafer state is programmed, the laser fuse LF1 is blown and, then, the defective row address BPR_RA becomes a logic level "LOW" to be applied to the defective row address transmitting unit 164. When the defective row address BPR_RA in the wafer is programmed in the BPR row address storing unit 163, the defective row address transmitting unit 164 preferentially outputs the defective row address BPR_RA to the row address comparing unit 165.

The row repair master signal generating unit 163 includes a first path indicating BPR information, a second path indicating PPR information and a NOR gate NO0. The first path includes a laser fuse LF2, a PMOS transistor P2, an NMOS transistor N2 and a latch L1. Also, the second path includes a NAND gate ND1 and an inverter. The row repair master signal generating unit 163 generates a row repair master signal R_MASTER indicating information that a row repair has been performed by a BPR or a PPR. The row repair master signal R_MASTER is set to a logic level "LOW" when the repair has been performed and is set to a logic level "HIGH" when the repair has not been performed. When the BPR is performed and the laser fuse is blown, a logic level at a node A is set to "HIGH," and then the row repair master signal R_MASTER is set to a logic level "LOW." Also, when the PPR is performed in a case where the row defective address is present after packaging, the logic level at a node B is set to "HIGH" in response to a logic level "HIGH" of the e-fuse master signal EFM and a logic level "HIGH" of the select signal SEL. Accordingly, the row repair master signal R_MASTER is set to a logic level "LOW." When either one of the BPR or the PPR is not performed, the row repair master signal R_MASTER is set to a logic level "HIGH" to cause all the defective row addresses RA_EN and RAB_EN of the defective row address transmitting unit 164 to be at a logic level "LOW."

The defective row address transmitting unit 164 includes a NAND gate ND2, a NOR gate NO1 and a NOR gate NO2. The NAND gate ND2 receives the addresses PPR_RA and BPR_RA to perform a logical NAND operation of the inputs. The NOR gate NO1 receives an output of the NAND gate ND2 and the row repair master signal R_MASTER and performs a logical NOR operation of the inputs to output the defective row address RA_EN. Also, the NOR gate NO2 receives an output of the NOR gate NO1 and the row repair master signal R_MASTER and performs a logical NOR operation of the inputs to output the defective row address bar RAB_EN. The defective row address transmitting unit 164 transmits either one of the defective row addresses PPR_RA and BPR_RA to the row address comparing unit 165. When the row repair master signal R_MASTER is at a logic level "HIGH," both the defective row address RA_EN and the defective row address bar RAB_EN are transmitted at a logic level "LOW" to the row address comparing unit 165. Also, when the row repair master signal R_MASTER is at a logic level "LOW," one of the PPR defective row address PPR_RA and the BPR defective row address BPR_RA is provided as the defective row address RA_EN or RAB_EN to the row address comparing unit 165.

Then, when the BPR has been performed during the wafer state, the BPR defective address BPR_RA is transmitted to the row address comparing unit 165, and when the BPR has not been performed during the wafer state and the PPR has been performed after packaging, the PPR defective address PPR_RA is transmitted to the defective row address transmitting unit 164. In other words, the row repair control unit 160 is preferentially used for the BPR during the wafer state. Further, when the row repair control unit 160 is not used for the BPR, the row repair control unit 160 may be used during the PPR after packaging.

The address comparing unit 165 includes a plurality of NMOS transistor pairs NP0, NP1 and NP2, an NMOS transistor N3 and a NAND gate ND3. The drains of NMOS transistor pairs NP0, NP1 and NP2 are commonly coupled to an output terminal of the address generating unit 110 to receive the row addresses. The gates drains of NMOS transistor pairs NP0, NP1 and NP2 receive the defective address information, and sources drains of NMOS transistor pairs NP0, NP1 and NP2 are coupled together. The NMOS transistor N3 controls an operation of the row address comparing unit 165 in response to the row repair master signal R_MASTER. The row address comparing unit 165 compares the defective row addresses RA_EN and RAB_EN output from the defective address transmitting unit 164 with the row address RA output from the address generating unit 110, and outputs a row repair enable signal R_REP when the comparison results are identical. The row address comparing unit 165 does not operate when the row repair master signal R_MASTER is at a logic level "HIGH," and the row address comparing unit 165 compares the defective addresses RA_EN and RAB_EN with the row address RA only when the row repair master signal R_MASTER is at a logic level "LOW."

The row repair control unit 160 has been described as a working example of a more general repair control unit—row or column.

However, with reference to the particular examples illustrated, the PPR column address selecting unit 171 of the column repair control unit 170 further includes an inverter IN1. Thus, the PPR column address selecting unit 171 receives the select signal SEL through the inverter IN1 as shown in FIGS. 3B and 4B. In other words, the PPR column address selecting unit 171 receives the defective address E_FADDR of the e-fuse box unit 150 to provide a PPR defective column address PPR_CA to a defective column address transmitting unit 174 in response to the select signal SEL having a second state indicating a column PPR. Also, a column repair master signal generating unit 173 receives the select signal SEL through an inverter IN2 and provides a column repair master signal C_MASTER set to a logic level "LOW" to the defective column address transmitting unit 174 in response to the select signal SEL having the second state. As a result, the defective column address transmitting unit 174 transmits the defective addresses CA_EN and CAB_EN to a column address comparing unit 175.

Hereinafter, a method of performing an exemplary PPR after packaging, according to an embodiment of the invention will be described with reference to FIGS. 1 through 5B.

First, a defective address is ascertained through a memory test after packaging. Then, a further determination is made as to whether the defective address corresponds to a row defect or a column defect.

Thereafter, the e-fuse master unit 130 receives the PPR master signal MRS_MASTER from the mode register 121 to program for the e-fuse master signal EFM to be set to a logic level "HIGH." When the defective address corresponds to a row defect, the row/column selecting e-fuse control signal MRS_SEL of the mode register 121 is set to a logic level "HIGH" to program the row/column selecting e-fuse unit 140 so that the select signal SEL may be set to a logic level "HIGH." However, when the defective address corresponds to a column defect, the row/column selecting e-fuse control signal MRS_SEL of the mode register 121 is set to a logic level "LOW" to maintain the select signal SEL at a logic level "LOW."

Next, the mode register 121 receives the defective address to generate the fuse address control signal MRS_FADDR, and then the address e-fuse box unit 150 is programmed to store the defective address E_FADDR to provide the defective address R_ADDR to the PPR row address selecting unit 161 and the PPR column address selecting unit 171. When the defective address corresponds to a column defect, the PPR row address selecting unit 161 receives the defective address E_FADDR to provide the PPR row address to the defective row address transmitting unit 164 in response to a logic level "HIGH" of the select signal SEL, and then the defective row address transmitting unit 164 generates the defective addresses RA_EN and RAB_EN to provide the generated defective addresses RA_EN and RAB_EN to the row address comparing unit 165. On the other hand, when the defective address corresponds to a column defect, the column address selecting unit 171 receives the defective address E_FADDR to provide a PPR column address to the defective column address transmitting unit 174 in response to a logic level "LOW" of the select signal SEL, and then the defective column address transmitting unit 174 generates the defective addresses CA_EN and CAB_EN to provide the generated defective addresses CA_EN and CAB_EN to the column address comparing unit 175.

Next, when the defective addresses RA_EN and RAB_EN transmitted to the row address transmitting unit 165 are identical with the row address RA output from the address generating unit 110, the row address transmitting unit 165 provides the row repair enable signal R_REP to the row repair driving unit 180 to perform the row repair. However, when the defective addresses CA_EN and CAB_EN transmitted to the column address transmitting unit 175 are identical with the column address CA outputted from the address generating unit 110, the column address transmitting unit 175 provides the column repair enable signal C_REP to the column repair driving unit 190 to perform the column repair.

Using this approach, a repair circuit and method of repairing defects in a semiconductor memory device according to embodiments of the invention significantly reduce the conventionally occurring increase in layout size associated with the provision of a PPR capability. This is accomplished in one aspect by the use of an address e-fuse box to selectively perform a row repair or column repair after the semiconductor memory device has been packaged.

While the example embodiments of the present invention and their advantages have been described in some detail, it should be understood that various changes, substitutions and alterations may be made herein without departing from the scope of the invention as defined by the following claims.

What is claimed is:

1. A repair circuit for a semiconductor memory device, comprising:
    an address generating unit configured to generate a row address or a column address in response to a control signal;
    an address electrical fuse (e-fuse) box unit configured to store a defective address after packaging;
    a row/column selecting e-fuse unit configured to generate a select signal for determining whether the defective address corresponds to a row defect or a column defect;
    a row repair control unit configured to compare the defective address after packaging with the row address in response to a first state of the select signal; and
    a column repair control unit configured to compare the defective address after packaging with the column address in response to a second state of the select signal.

2. The repair circuit of claim 1, further comprising a mode register configured to generate the control signal.

3. The repair circuit of claim 2, wherein the row/column selecting e-fuse unit determines the state of the select signal in response to the control signal.

4. The repair circuit of claim 3, wherein the row repair control unit further comprises a laser fuse unit configured to store a defective address before packaging, the row repair control unit being further configured to select one of the defective address after packaging and the defective address before packaging to compare the selected defective address with the row address.

5. The repair circuit of claim 4, wherein the row repair control unit is further configured to select the defective address before packaging to compare the selected defective address with the row address when the defective address before packaging is stored in the laser fuse unit.

6. The repair circuit of claim 5, wherein the row repair control unit comprises a row repair master signal generating unit configured to generate a master signal indicating whether a before-package repair (BPR) is performed or whether a post-package repair (PPR) is performed.

7. The repair circuit of claim 6, wherein the row repair control unit compares the defective address with the row address only when at least one of the BPR and the PPR is performed, as indicated by an output from the row repair master signal generating unit.

8. The repair circuit of claim 3, wherein the column repair control unit further comprises a laser fuse unit configured to store a defective address before packaging, the column repair control unit being further configured to select one of the defective address after packaging and the defective address before packaging to compare the selected defective address with the column address.

9. The repair circuit of claim 8, wherein the column repair control unit is further configured to select the defective address before packaging to compare the selected defective address with the column address when the defective address before packaging is stored in the laser fuse unit.

10. The repair circuit of claim 9, wherein the column repair control unit comprises a column repair master signal generating unit configured to generate a master signal indicating whether a BPR is performed or whether a PPR is performed.

11. The repair circuit of claim 10, wherein the column repair control unit compares the defective address with the column address only when at least one of the BPR and the PPR is performed, as indicated by an output from the column repair master signal generating unit.

12. The repair circuit of claim 1, wherein the row repair control unit comprises a row address comparing unit configured to compare the defective address after packaging with the row address in response to the first state of the select signal; and the repair circuit further comprises:
 a row repair driving unit configured to activate a word line according to an output of the row address comparing unit.

13. The repair circuit of claim 12, wherein the column repair control unit comprises a column address comparing unit configured to compare the defective address with the column address in response to the second state of the select signal; and the repair circuit further comprises:
 a column repair driving unit configured to activate a bit line according to an output of the column address comparing unit.

14. A method of repairing defects in a semiconductor memory device, comprising:
 identifying a defective address in the semiconductor memory device after packaging;
 generating a post-package repair (PPR) master signal;
 programming a row/column selecting e-fuse unit based on whether the defective address corresponds to a row defect or a column defect;
 storing the defective address in an address e-fuse box unit;
 comparing the defective address stored in the address e-fuse box unit with a row address when the defective address corresponds to the row defect; and
 comparing the defective address stored in the address e-fuse box unit with a column address when the defective address corresponds to the column defect.

15. A repair circuit for a semiconductor memory device, comprising:
 an address fuse unit configured to perform electrical programming of a fuse in accordance with a defective address identified in the semiconductor memory device after packaging;
 a row/column selecting fuse unit configured to perform electrical programming of a fuse in accordance with an indication of whether the defective address corresponds to a row defect or a column defect;
 a row repair control unit configured to drive a row repair circuit when a row address identical to the defective address programmed in the address fuse unit is input in response to a programming state of the row/column selecting fuse unit; and
 a column repair control unit configured to drive a column repair circuit when a column address identical to the defective address programmed in the address fuse unit is input in response to a programming state of the row/column selecting fuse unit.

16. A method of repairing defects in a semiconductor memory device, comprising:
 storing a first defective address corresponding to a defect detected in a semiconductor memory device after packaging, and providing a corresponding first defective address signal to a row repair control unit and a column repair control unit;
 in response to a control signal, generating a select signal having either a first state or a second state;
 performing electrical programming of a fuse in accordance with the first defective address signal and the select signal using either a row repair control unit and a row repair driving unit when the select signal has the first state, or a column repair control unit and a column repair driving unit when the select signal has the second state.

17. A method of repairing defects in a semiconductor memory device, comprising:
 in response to a control signal, generating a select signal having either a first state or a second state;
 storing a first defective address corresponding to a defect detected in a semiconductor memory device after packaging;
 storing a second defective address corresponding to a defect detected in the semiconductor memory device before packaging; and
 selecting either the first defective address or the second defective address in response to a master repair signal and applying the selected first defective address or second defective address to an address comparing unit,
 wherein when the select signal has the first state, the first defective address is a first defective row address, the second defective address is a second defective row address, the master signal is a row master signal, and the address comparing unit is a row address comparing unit configured to receive and compare a row address with the selected one of the first defective row address or the second defective row address, and
 when the select signal has a second state, the first defective address is a first defective column address, the second defective address is a second defective column address, the master signal is a column master signal, and the address comparing unit is a column address comparing unit configured to receive and compare a column address with the selected one of the first defective column address or the second defective column address.

* * * * *